US006800214B2

(12) United States Patent
Takushima

(10) Patent No.: US 6,800,214 B2
(45) Date of Patent: Oct. 5, 2004

(54) METHOD FOR CORRECTING CHARACTERISTICS OF ATTENUATED PHASE-SHIFT MASK

(75) Inventor: Katsuhiro Takushima, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/300,777

(22) Filed: Nov. 21, 2002

(65) Prior Publication Data

US 2003/0071018 A1 Apr. 17, 2003

Related U.S. Application Data

(63) Continuation of application No. 09/618,641, filed on Jul. 18, 2000, now Pat. No. 6,508,949.

(30) Foreign Application Priority Data

Jul. 22, 1999 (JP) .......................................... 11-207537

(51) Int. Cl.[7] ............................................... B44C 1/22
(52) U.S. Cl. ........................... 216/101; 216/12; 216/24; 216/41; 216/49; 216/51; 216/83; 216/84; 216/100; 216/108; 216/109; 430/5; 438/22; 438/27; 438/31; 438/32

(58) Field of Search ............................. 216/12, 24, 41, 216/49, 51, 83, 84, 100, 101, 108, 109; 430/5; 438/22, 27, 37, 32

(56) References Cited

U.S. PATENT DOCUMENTS

| | | | | | |
|---|---|---|---|---|---|
| 5,032,217 A | * | 7/1991 | Tanaka | ........................ | 134/153 |
| 5,503,951 A | * | 4/1996 | Flanders et al. | ................ | 430/5 |
| 5,789,118 A | * | 8/1998 | Liu et al. | ........................ | 430/22 |
| 5,942,356 A | * | 8/1999 | Mitsui et al. | ................ | 428/432 |
| 6,037,083 A | * | 3/2000 | Mitsui | ........................... | 430/5 |
| 6,123,865 A | * | 9/2000 | Lin et al. | ...................... | 134/1.3 |
| 6,242,138 B1 | * | 6/2001 | Mitsui et al. | .................. | 430/5 |

* cited by examiner

Primary Examiner—Randy Gulakowski
Assistant Examiner—Gentle E Winter
(74) Attorney, Agent, or Firm—Junichi Mimura

(57) ABSTRACT

A method for correcting characteristics of an attenuated phase-shift mask having an attenuated layer including (a) storing a data in a memory, which shows a correlation between characteristics and process conditions, (b) measuring the characteristics of the attenuated phase-shift mask, (c) calculating a appropriate process condition from the result of the step (b) and the data stored in the memory; and (d) soaking the attenuated phase-shift mask into a liquid solution for a certain time-that is calculated in the step (c) to change thickness and composition of the attenuated layer.

6 Claims, 13 Drawing Sheets

METHOD FOR CORRECTING CHARACTERISTICS OF ATTENUATED PHASE-SHIFT MASK

This application claims the priority benefit of Japanese Patent Application No. 11-207537, filed Jul. 22, 1999, the entire subject matter of which is incorporated herein by reference. This application is a continuation of applicant's application Ser. No. 09/618,641, filed Jul. 18, 2000 now U.S. Pat. No. 6,508,949.

CROSS-REFERENCE TO RELATED APPLICATION

This application claims the priority benefit of Japanese Patent Application No. 11-207537, filed Jul. 22, 1999, the entire subject matter of which is incorporated herein of reference.

BACKGROUND OF THE INVENTION

1. Field of the invention

The invention relates to a method for correcting characteristics of an attenuated phase-shift mask. Specifically, the characteristics of the attenuated phase-shift mask is modified by changing a thickness or a composition of a mask pattern layer in response to a particular data.

2. Description of the related art

With an increase in the level of integration of semiconductor integrated circuits, there have been rapid advances in minimizing micropatterns used for circuitry, so that a high resolution technology and a sufficient depth of focus (DOF) has been required. Therefore, a conventional photomask 1 shown in FIG. 14, which includes a light shielding layer 16 formed on a glass substrate 2 to form micropatterns, cannot satisfy the requirements of the resolution and the DOF in a high integration lithography process because the light passing through the mask 1 is diffracted.

To resolve this problem, a variety of types of phase-shift mask has been proposed to date, including an attenuated phase-shift mask, a Lebenson-type phase-shift mask, a phase-shift mask having an optical proximity correction, a self-align phase-shift mask and a transmittance-type phase-shift mask. Specifically, the attenuated phase-shift mask is widely used because of its simple construction.

The attenuated phase-shift mask 10 shown in FIG. 2 includes a attenuated layer 14 which is formed on a glass substrate 12, and a light shielding layer 16 form on parts of the attenuated layer 14. Referring to FIG. 15, when light passes through the mask 10, a phase $\theta_1$ of the light that passes through the attenuated layer 14 is shifted from a phase $\theta_2$ of the light that passes only through the substrate 12 for about 180 degree because the transmitting speed of the light that passed through the attenuated layer 14 becomes slow. As a result, the light which passes through around the border between the attenuated layer 14 and the substrate 12 is setoff by the phase difference. Therefore, the resolution can be improved.

However, it is difficult to control a thickness and a quality of the attenuated layer. As the attenuated layer is formed on the substrate by a vacuum evaporation method, the thickness and the quality of the attenuated layer are easily influenced by the changes of the process environments or conditions. Therefore, a required transmittance and phase difference of the mask cannot be obtained. Further, once the attenuated phase-shift mask having an unsatisfied attenuated layer is formed, a required transmittance and phase difference of the mask cannot be modified by additional evaporation processes.

SUMMARY OF THE INVENTION

An objective of the invention is to resolve the above-described problem and to provide a method for correcting characteristics such as a transmittance and a phase difference, of an attenuated phase-shift mask.

The objective is achieved by a method for correcting characteristics of an attenuated phase-shift mask having an attenuated layer including (a) storing a data in a memory, which shows a correlation between characteristics and process conditions, (b) measuring the characteristics of the attenuated phase-shift mask, (c) calculating a appropriate process condition from the result of the step (b) and the data stored in the memory; and (d) soaking the attenuated phase-shift mask into a liquid solution for a certain time that is calculated in the step (c) to change thickness and composition of the attenuated layer.

BRIEF DESCRIPTION OF THE DRAWINGS

The invention will be more particularly described with reference to the accompanying drawings in which.

DETAILED DESCRIPTION OF THE PREFERRED EMBODIMENTS

In a first of fourth embodiments of the invention, a transmitting characteristic and a phase characteristic of an attenuated phase-shift mask are corrected by the method described below. First, a method for correcting a transmitting characteristic of an attenuated phase-shift mask is explained.

Figure 1:
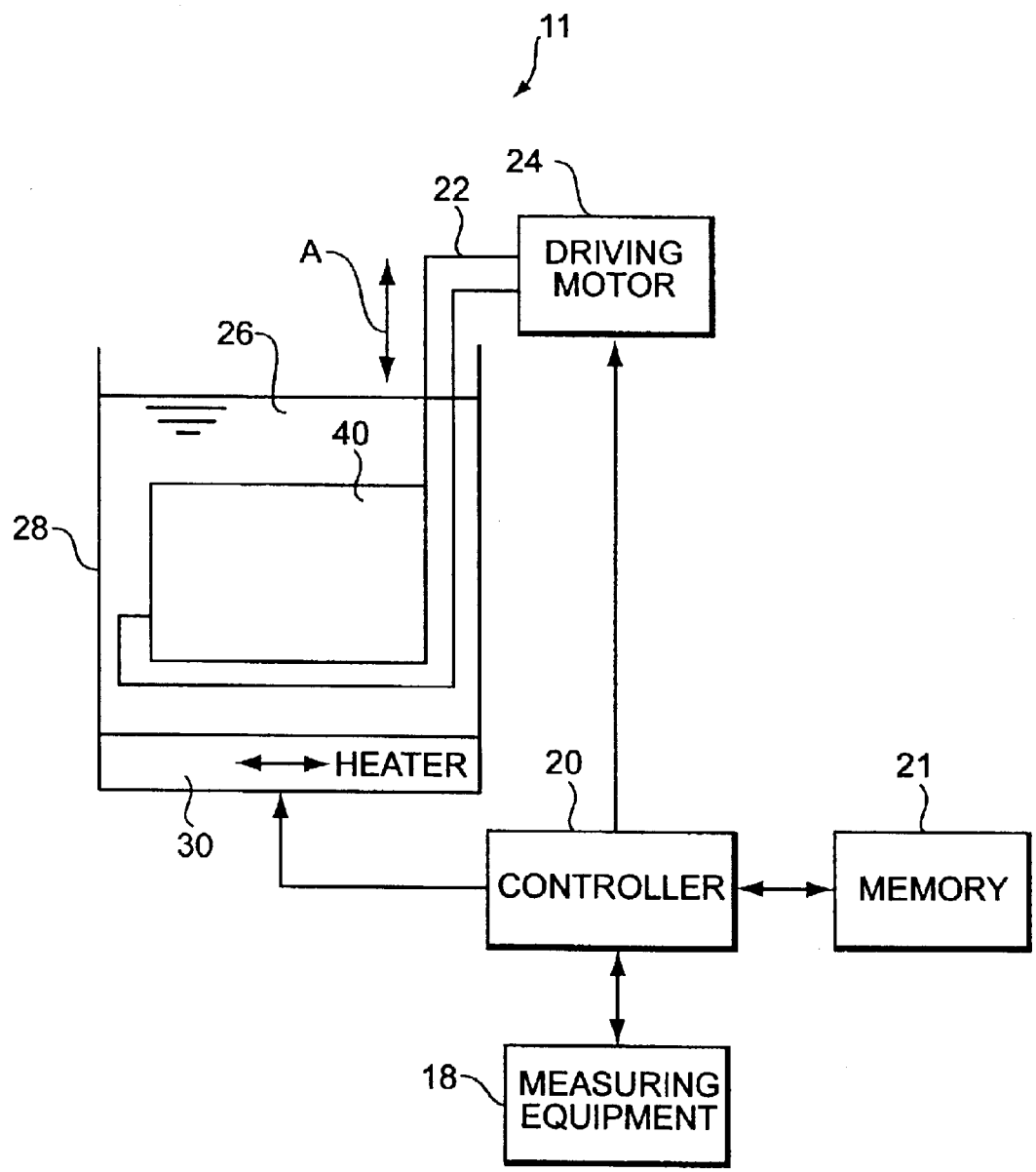
FIGS. 1 is a schematic diagram showing a correction device used in a first of fourth embodiments of the invention.
Figure 2:
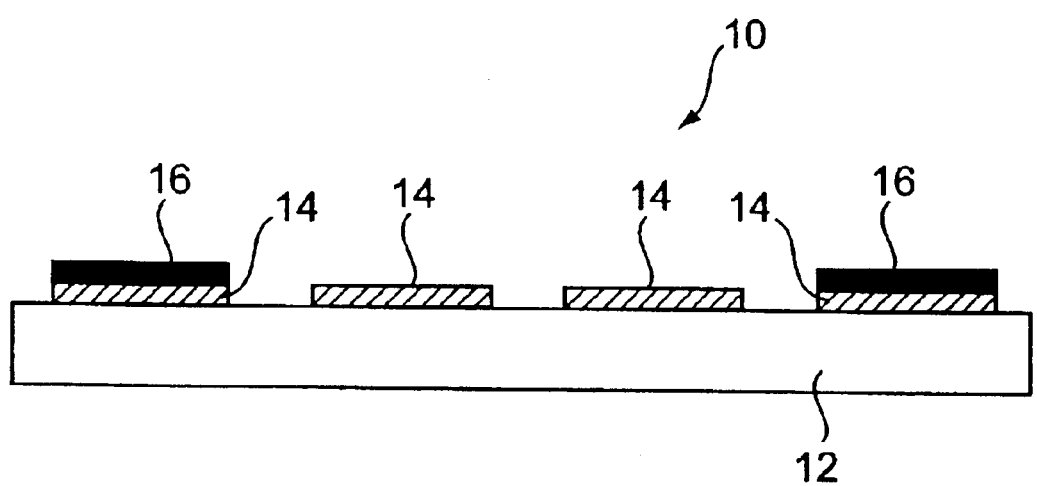
FIG. 2 is a sectional view of a typical attenuated phase-shift mask.

Referring to FIG. 1, a correcting device 11 having a controller 20 includes a measuring equipment 18, a memory 21, a driving motor 24 and a heater 30, and each of them is connected to the controller 20. The measuring equipment 18 measures a transmittance of an attenuated phase-shift mask. The memory 21 stores data showing the relationship between transmittance and process condition, which is obtained from some experimentation. A control program for operating the correcting device 11 is also stored in the memory 21. The heater 20 is attached at a bottom of a crystal container 28 to heat a liquid solution 26 therein. The liquid solution 26 is an acid solution which is a mixture of sulfuric acid and hydrogen peroxide ($H_2SO_4:H_2O_2=4:1$). A holder 22 is connected to the driving motor 24 at its one end, and holds an attenuated phase-shift mask 40 at its other end. The holder 22 is moved up and down in the direction A by the operation of the driving motor 24 to put the attenuated phase-shift mask 40 in the container 28.

The attenuated phase-shift mask 40 is manufactured in the following method. First, a thin attenuated layer of chromium fluoride is formed on a glass substrate by a spattering method, and then, a light shielding layer and a resist layer are formed on the attenuated layer. Second, circuit patterns are transformed on the resist layer by an electron beam lithography system. Next, unexposed resist layer is removed, circuit patters are formed on the substrate by etching the attenuated layer and the light shielding layer, and then, exposed resist layer used as the etching mask is removed. When the attenuated phase-shift mask 40, which is formed in the process decried above, does not have a required transmitting characteristic, the characteristic is corrected by the following method.

Figure 3:
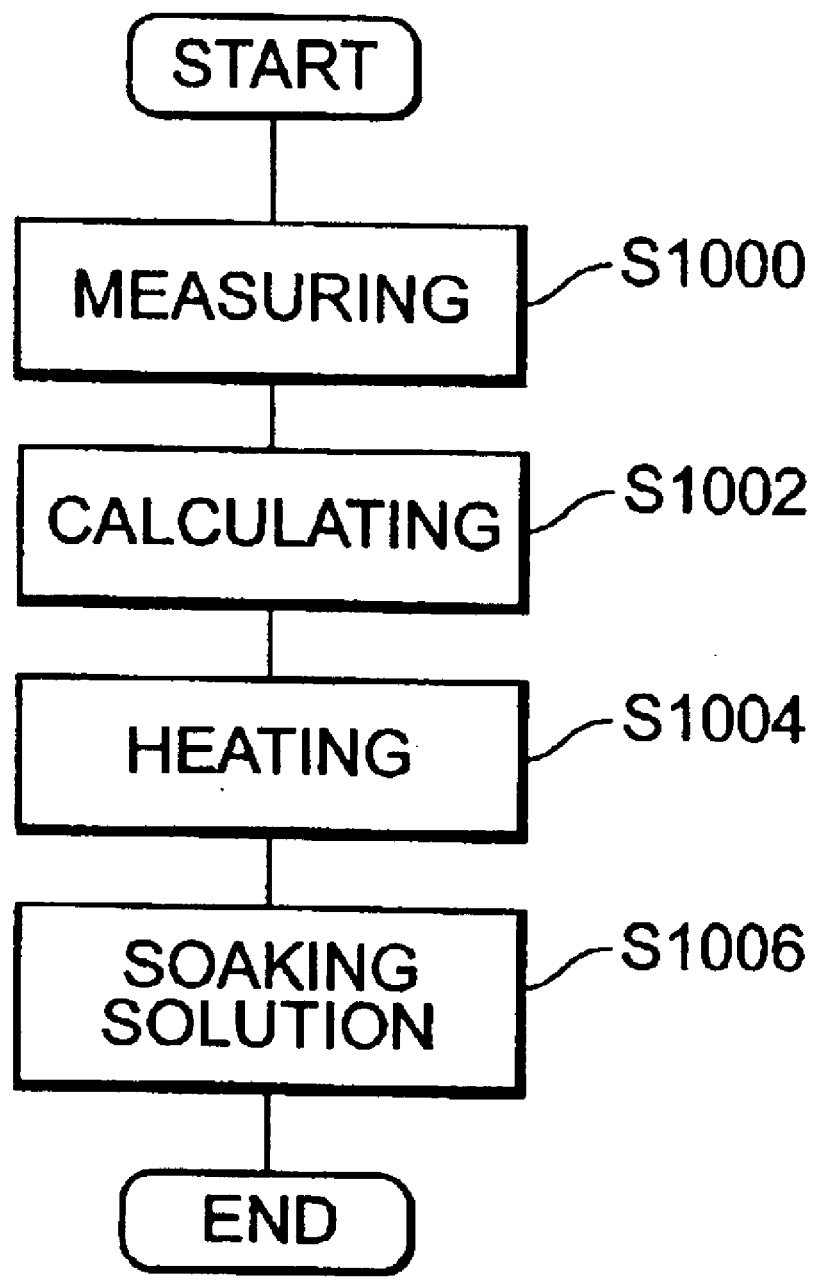
FIG. 3 is a flowchart to correcting characteristics of an attenuated phase-shift mask, according to the first embodiment of the invention.

Referring FIG. 3, first, the transmittance of the attenuated phase-shift mask 40 is measured by the measuring equipment 18 under the instruction form the controller 20. The measurement is performed by the following step. First, light having $\lambda=248$ nm is irradiated to an area where the attenuated layer is formed, and light intensity Ai before passing through the area and light intensity Ao after passing through the area are measured. Then, the transmittance B, which is (Ao/Ai)×100 (%), is calculated and output to the controller 20. In the controller 20, the transmittance as a result of the measurement is temporally stored <S1000>.

Next, the attenuated phase-shift mask 40 is placed on the holder 22, and then, an appropriate process condition is calculated. More precisely, a time that the attenuated phase-shift mask 40 is soaked in the liquid solution 26 is calculated, for example. As described above, data of correlation between transmittance and the process conditions including soaking time, kinds of liquid solution and heating temperature, is stored in the memory 21. For example, an amount of transmittance changes at 80° C. is 0.012%/min, and such data is stored in the memory 21.

If the measured transmittance is lower than the required transmittance that can obtain the resolution and the DOF, the transmittance can be corrected. If the required transmittance is 5.9% and the measured transmittance is 5.4%, the soaking time is calculated by the following formula.

the soaking time=0.5 (amount to be corrected)/0.012 (amount of transmittance changes)≈40(min)

Next, the temperature of the heater is set for 80° C. <S1002>.

After the liquid solution 26 is heated upto 80° C., the attenuated phase-shift mask 40 is soaked into the liquid solution 26 for 40 minutes by moving the holder 22 down under the instruction of the controller 20 <S1006>. Then, the attenuated phase-shift mask 11 is rinsed with pure water or warmed pure water for three minutes, and then, dried up by the IPA (isopropyl alcohol) vapor drying method.

The thickness and the composition of the attenuated layer are changed so that the transmittance is corrected to the desired transmittance.

Next, a method for correcting a phase characteristic of an attenuated phase-shift mask is explained. To correct a phase characteristic of an attenuated phase-shift mask, the same correcting device 11 shown in FIG. 1 is used also. However, an alkaline solution is used as the liquid solution 26, instead of the acid solution. The alkaline solution is, for example, a mixture of ammonia, hydrogen peroxide and water ($NH_3:H_2O_2:H_2O=0.5:1:5$). Further, The memory 21 stores data of correlation between a phase difference and the process conditions including soaking time, kinds of liquid solution and heating temperature, which is obtained from some experimentation.

Referring to FIG. 3 again, the correction of the phase difference of the attenuated phase-shift mask is performed as the same method for the correction of the transmittance. That is, (1) the phase difference of the attenuated phase-shift mask is measured <S1000>, (2) the process condition is calculated <S1002>, (3) the liquid solution is heated <S1004>, and then (4) the attenuated phase-shift mask is soaked in the liquid solution<S1006>. Here, in the step of S1000, the measurement is performed by the following step. First, light having $\lambda=248$ nm is irradiated to a first area where the attenuated layer is formed and a second area where the attenuated layer is not formed, and then phase of the light Pi passing through the first area and phase of the light Po passing through the second area are measured. Then, the phase difference P, which is Pi-Po, is calculated and output to the controller 20. In the controller 20, the transmittance as a result of the measurement is temporally stored. For example, data, which shows that an amount of changes of the phase difference at 70° C. is 0.3 degree/min, is stored in the memory 21. If the required phase difference is 179 degrees and the measured transmittance is 173 degrees, the soaking time is calculated by the following formula.

the soaking time=6 (amount to be corrected)/0.3 (amount of transmittance changes)≈20(min)

Therefore, if the attenuated phase-shift mask 40 is soaked in the liquid solution 26 for 20 minutes, the thickness and the composition of the attenuated layer are changed so that the phase difference is corrected to the desired phase difference. Of cause, if both transmittance and phase difference should be corrected, it is possible to performed the method for correcting the transmittance, and then to perform the method for correcting the phase difference.

Figure 4:
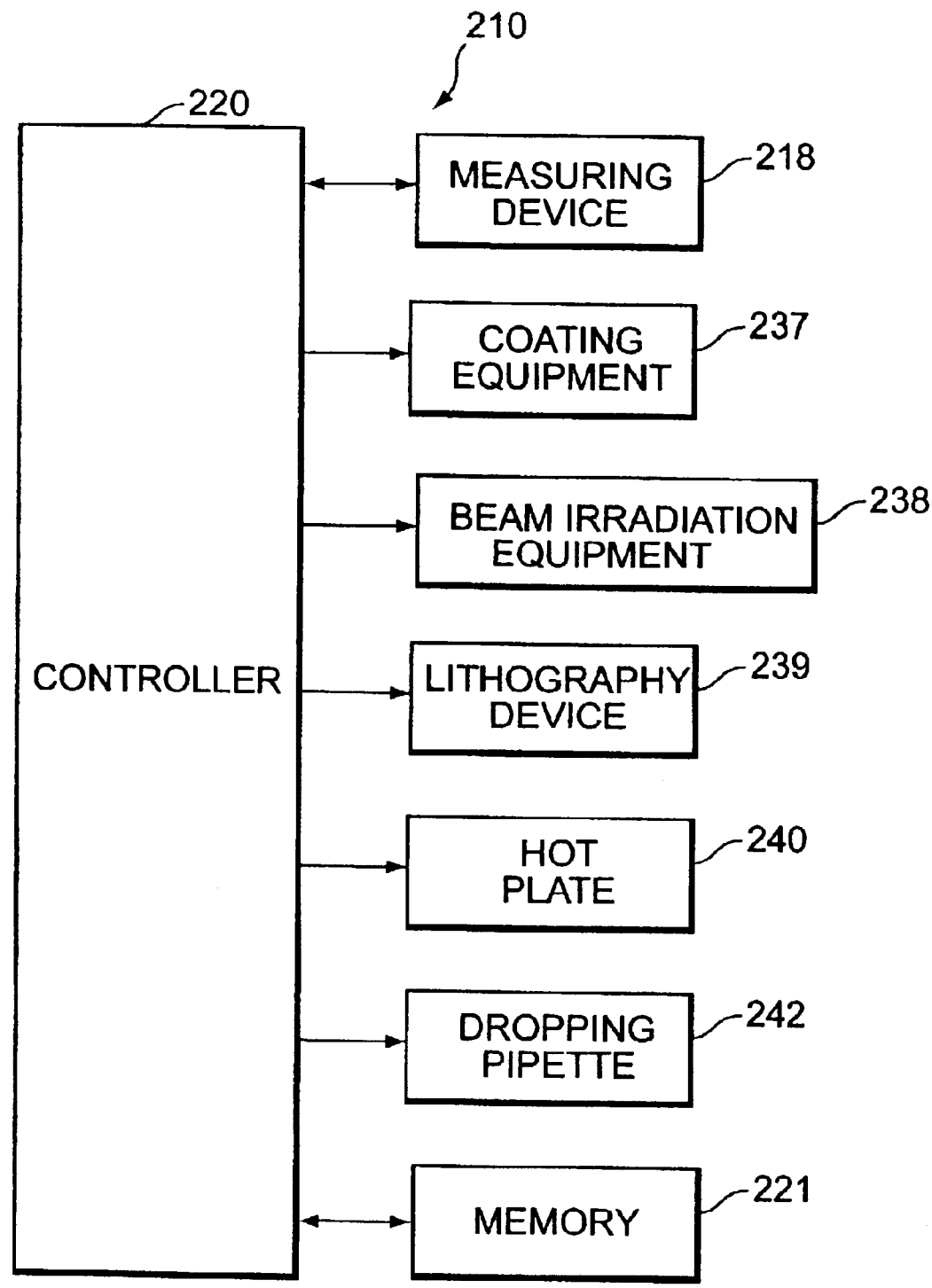
FIG. 4 is a schematic diagram showing a correction device used in the second embodiments of the invention.
Figure 5A:
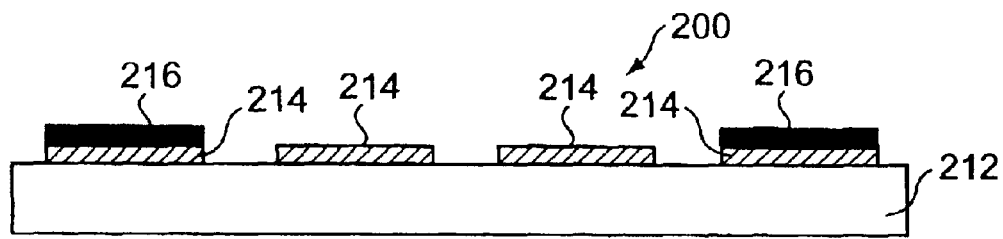
FIGS. 5A through 5E are sequential sectional views of a process for correcting characteristics of an attenuated phase-shift mask having an attenuated layer formed of CrF or CrOx, according to the second embodiments of the invention.
Figure 5B:
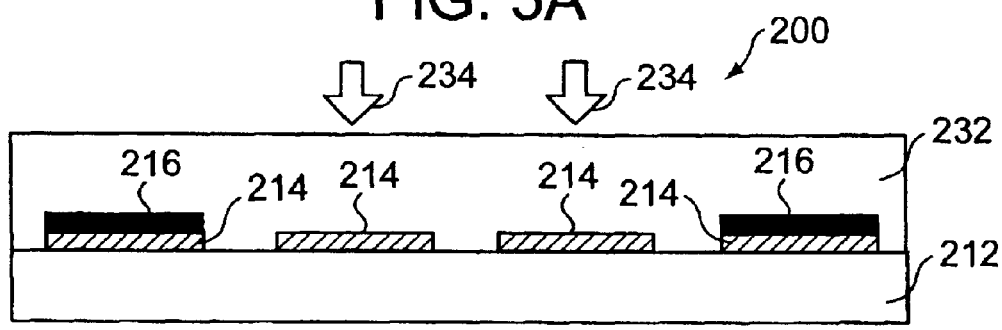
Figure 5C:
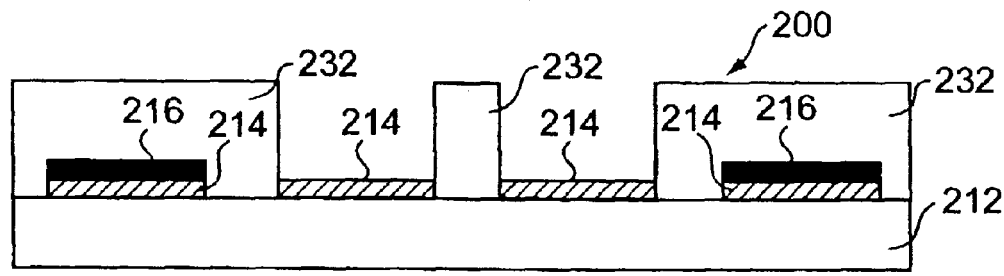
Figure 5D:
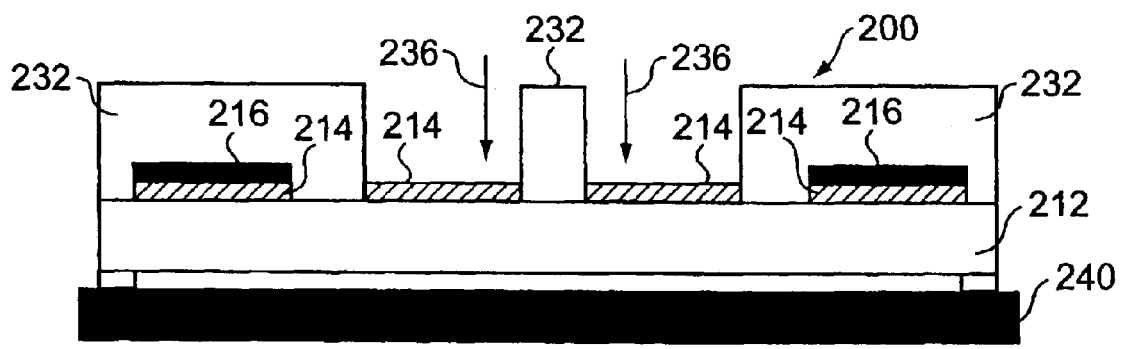
Figure 5E:
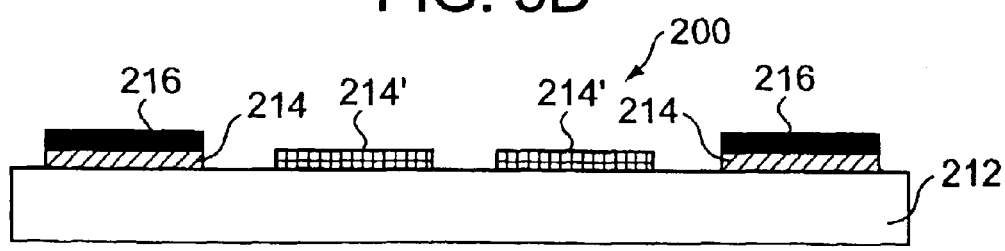
Figure 6:
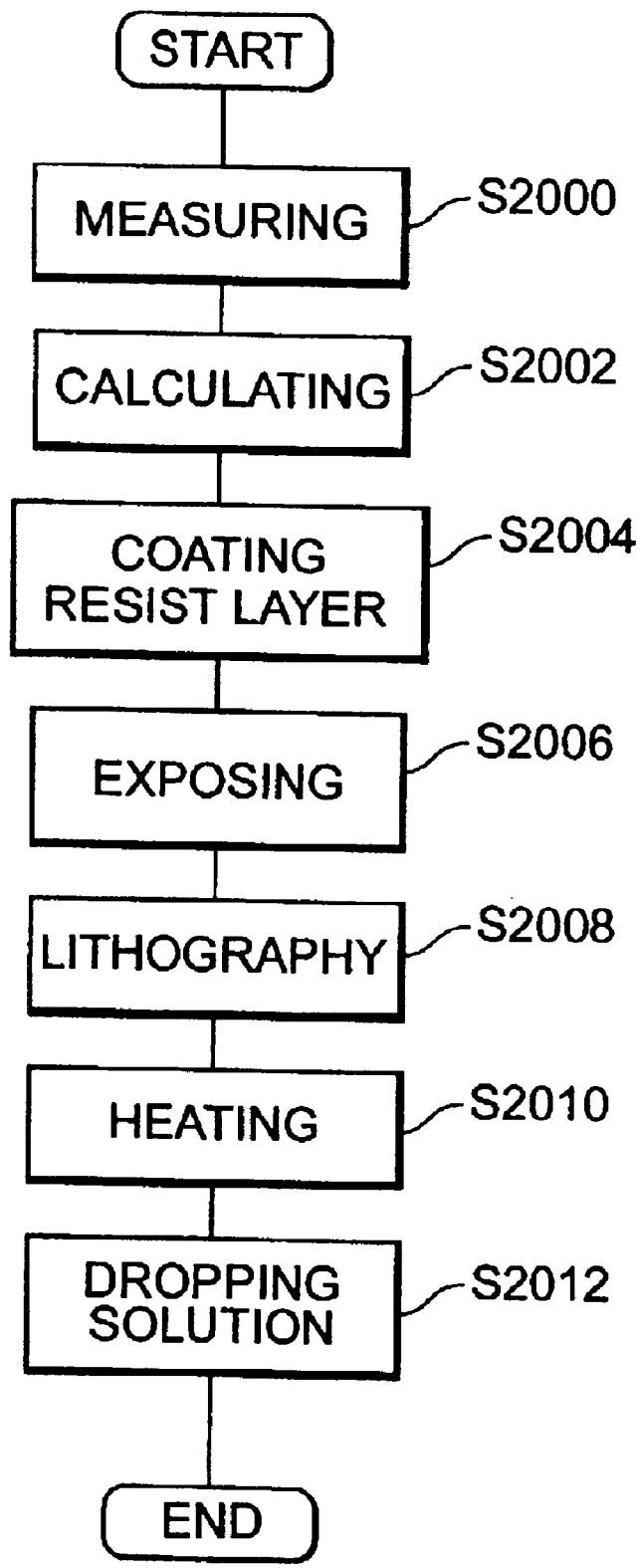
FIG. 6 is a flowchart to correcting characteristics of an attenuated phase-shift mask, according to the second embodiment of the invention.
Figure 7A:
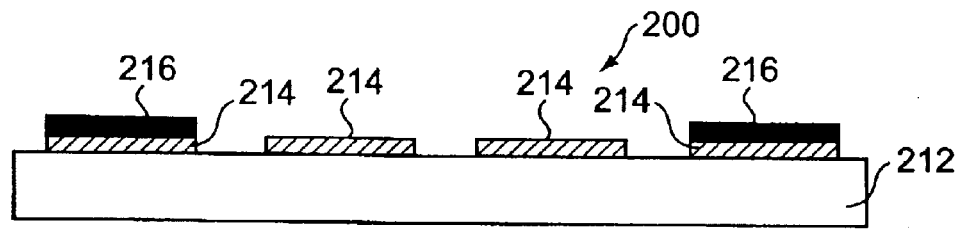
FIG. 7A through 7E are sequential sectional views of a process for correcting characteristics of an attenuated phase-shift mask having an attenuated layer formed of MoSi, according to an alternative of the second embodiments of the invention.
Figure 7B:
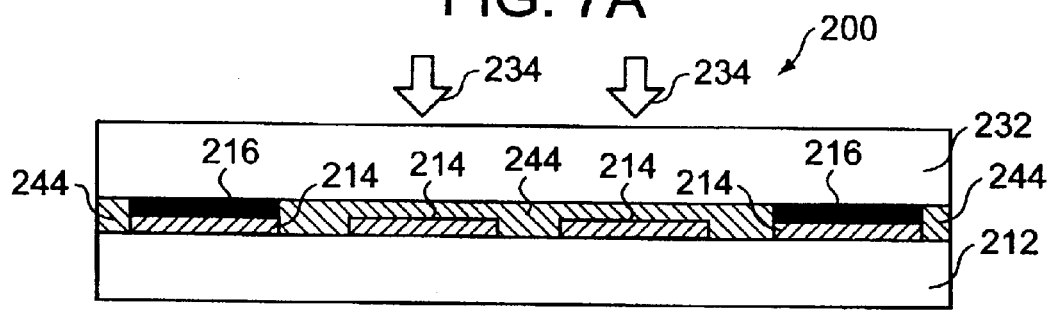
Figure 7C:
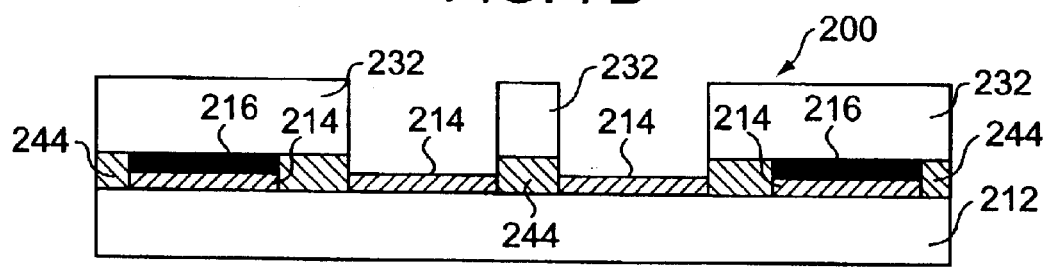
Figure 7D:
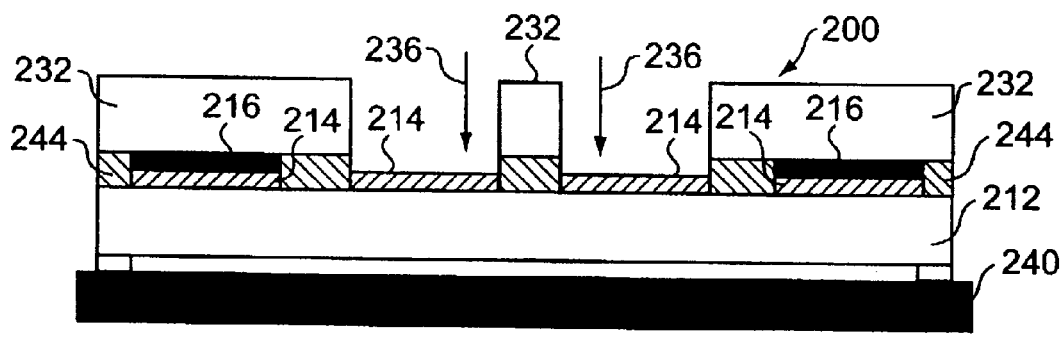
Figure 7E:
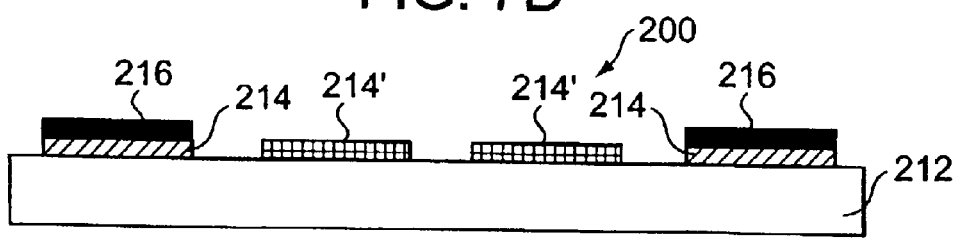

With reference to FIG. 4 through FIG. 6, the second embodiment is explained. First, a method for correcting a transmitting characteristic of an attenuated phase-shift mask is explained. Referring to FIG. 4, a correcting device 210 having a controller 220 includes a measuring equipment 218, a memory 221, a coating device 237 for coating a resist material on the attenuated mask 200, an electron beam irradiation equipment 238, a lithography device 239, a hot plate 240 for heating the attenuated mask 200, and a dropping pipette 242 for dropping liquid solution, and each of them is connected to the controller 20. The measuring equipment 218 measures a transmittance of an attenuated phase-shift mask. The memory 221 stores date of correlation between transmittance and process conditions, which is obtained from some experimentation. A control program for operating the correcting device 11 is also stored in the memory 21. The liquid solution that is dropped from the dropping pipette 242 is, for example, an acid solution which is a mixture of sulfuric acid and hydrogen peroxide ($H_2SO_4:H_2O_2=4:1$).

Referring to FIG. 5A and FIG. 6, an attenuated phase-shift mask 200 having a thin patterned attenuated layer 214 of chromium fluoride which formed on a glass substrate 212 by a spattering method, and a light shielding layer 216, is formed. The transmittance of the attenuated phase-shift mask 200 is measured by the measuring equipment 218 under the instruction form the controller 220. The measurement is performed by the same method for measuring the transmittance described in the first embodiment. In the controller 220, the transmittance as a result of the measurement is temporally stored <S2000>.

Next, an area of the attenuated layer 214 where the required transmittance is not satisfied, that is the area to be corrected is found by the measurement result. Then, an appropriate process condition is calculated by using the data in the memory 221 <S2002>. More precisely, a time that the liquid solution is dropped on the attenuated phase-shift mask 200 is calculated, for example. As described above, data of correlation between transmittance and the process conditions including time for dropping the liquid solution, kinds of liquid solution and heating temperature by the hot plate 240, is stored in the memory 221. For example, an amount of transmittance changes at 90° C. is 0.012%/min, and such data is stored in the memory 221.

If the measured transmittance is lower than the required transmittance that can obtain the resolution and the DOF, the transmittance can be corrected. If the required transmittance is 5.9% and the measured transmittance is 5.7%, the dropping time of the liquid solution is calculated by the following formula.

the dropping time=0.3 (amount to be corrected)/0.012 (amount of transmittance changes)≈20(min)

Next, referring to FIG. 5B and FIG. 6, after the appropriate process condition is determined, a positive resist film 232 having a thickness of 15000 Å is formed on the attenuated mask 200 by using the coating equipment 236 under the instruction from the controller 220 <S2004>. Then, an electron beam 234 is irradiated by the electron beam irradiation equipment 238 on parts of the resist film 232 in the area where the attenuated layer 214 to be corrected is formed. In this embodiment, Nd:YAG Laser whose waveform is 633 nm as the second high frequency is used. By this step, the parts of the resist film 232 in the area where the attenuated layer 214 to be corrected is exposed <S2006>.

Next, referring to FIG. 5C and FIG. 6, the parts of the resist film 232 in the area where the attenuated layer 14 to be corrected is removed by the lithography device 239 <S2008>. Then, referring to FIG. 5D and FIG. 6, the attenuated phase-shift mask 200 is placed on the hot plate 240, and then, the hot plate 240 is heated upto 90° C. <S2010>. Next, the liquid solution 236 is dropped for 20 minutes by the dropping pipette 242 on the exposed attenuated layer 214 <S2012>. Then, the attenuated phase-shift mask 200 is rinsed with pure water or warmed pure water for three minutes, and then, dried up by the IPA (isopropyl alcohol) vapor drying method.

Referring to FIG. 5E, the thickness and the composition of the attenuated layer 214' are changed by the liquid solution 236 so that the transmittance is corrected to the desired transmittance. Then, the resist film 232 is removed, and then, the attenuated phase-shift mask 200 is rinsed with pure water or warmed pure water for three minutes again, and, dried up by the IPA (isopropyl alcohol) vapor drying method again.

Next, a method for correcting a phase characteristic of an attenuated phase-shift mask 200 is explained. To correct a phase characteristic of an attenuated phase-shift mask 200, the same correcting device 210 shown in FIG. 4 and the same flowchart shown in FIG. 5 are used also. However, an alkaline solution is used as the liquid solution 236, instead of the acid solution. The alkaline solution is, for example, a mixture of ammonia, hydrogen peroxide and water ($NH_3:H_2O_2:H_2O=0.5:1:5$). Further, The memory 221 stores data of correlation between a phase difference and the process conditions including time for dropping the liquid solution 236, kinds of liquid solution and heating temperature, which is obtained from some experimentation.

Referring to FIG. 6 again, the correction of the phase difference of the attenuated phase-shift mask is performed as the same method for the correction of the transmittance. That is, (1) the phase difference of the attenuated phase-shift mask is measured <S2000>, (2) the process condition is calculated <S2002>, (3) the resist film is formed <S2004>, (4) parts of the resist film are exposed by the electron beam <S2006>, (5) the exposed resist film is removed <S2008>, (6) the attenuated phase-shift mask is heated <S2010>, (7) the liquid solution is dropped <S2012>, and then (8) the attenuated phase-shift mask is rinsed and dried. Here, the measurement step in S2000 is performed by the same method for measuring the phase difference described in the first embodiment. For example, data, which shows that an amount of changes of the phase difference at 70° C. is 0.3 degree/min, is stored in the memory 21. If the required phase difference is 178 degrees and the measured transmittance is 173 degrees, the time for dropping the liquid solution is calculated by the following formula.

the dropping time=5 (amount to be corrected)/0.3 (amount of transmittance changes)≈15(min)

Therefore, if the liquid solution is dropped for 15 minutes on the attenuated phase-shift mask, the thickness and the composition of the attenuated layer are changed so that the phase difference is corrected to the desired phase difference. Of cause, if both transmittance and phase difference should be corrected, it is possible to performed the method for correcting the transmittance, and then to perform the method for correcting the phase difference.

According to the second embodiment of the invention, the attenuated phase-shift mask having a defect partially on the characteristics as to the transmittance and the phase difference can be corrected.

Figure 8:
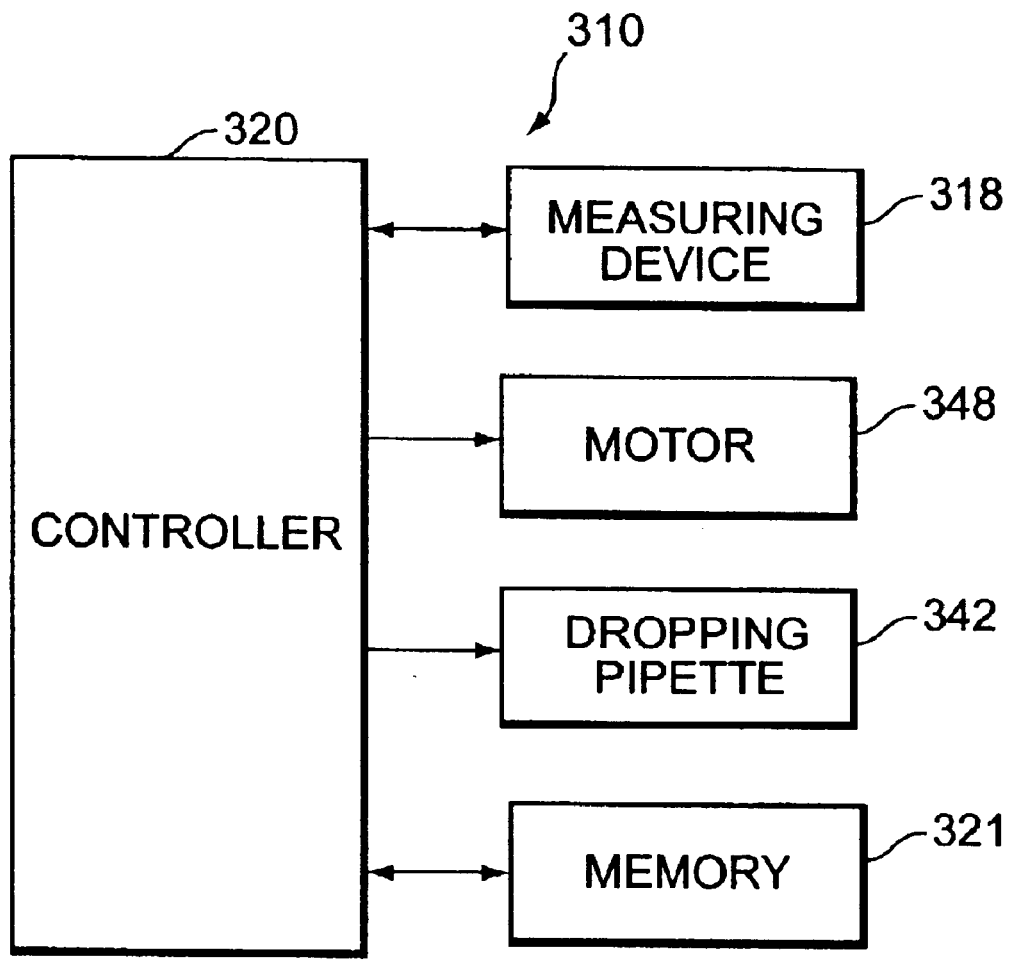
FIG. 8 is a schematic diagram showing a correction device used in the third embodiments of the invention.
Figure 9A:
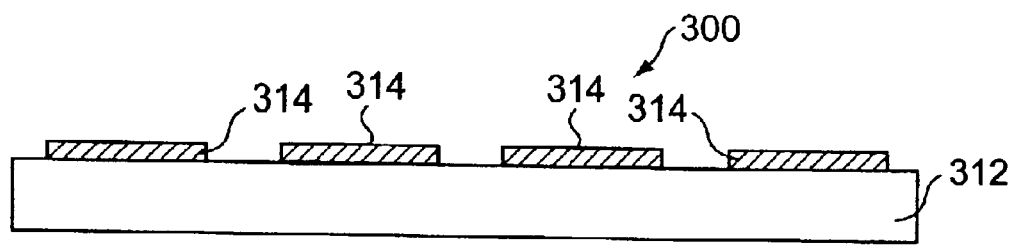
FIGS. 9A through 9C are sequential sectional views of a process for correcting characteristics of an attenuated phase-shift mask, according to the third embodiments of the invention.
Figure 9B:
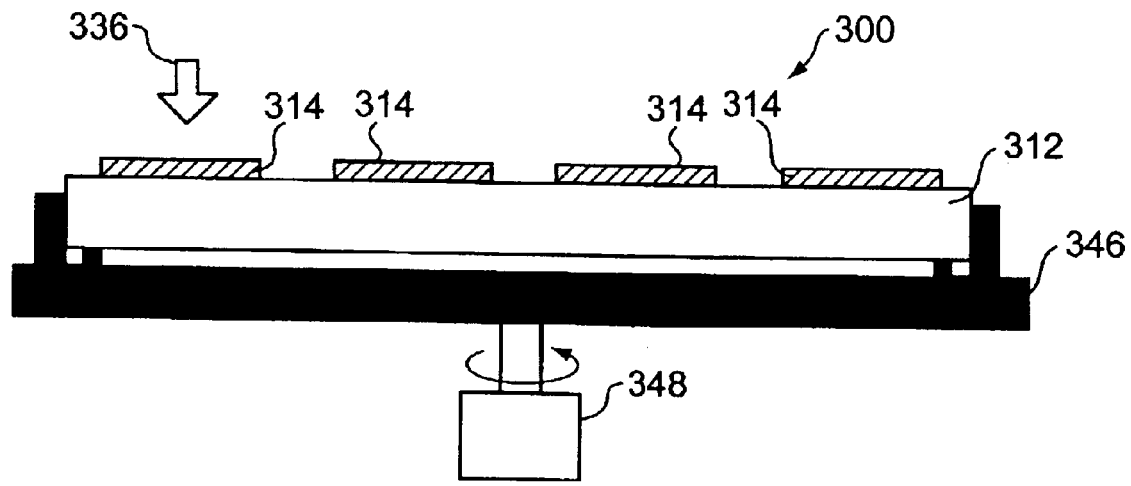
Figure 9C:
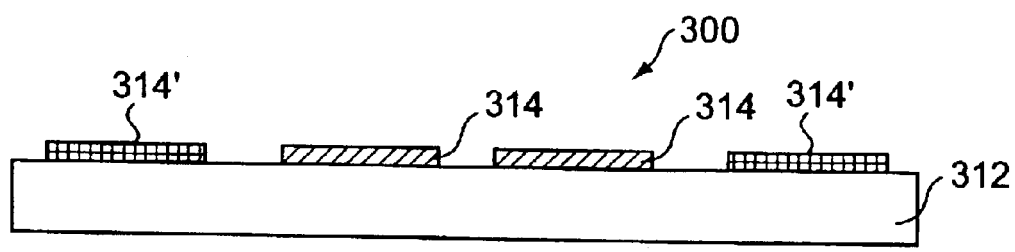
Figure 10:
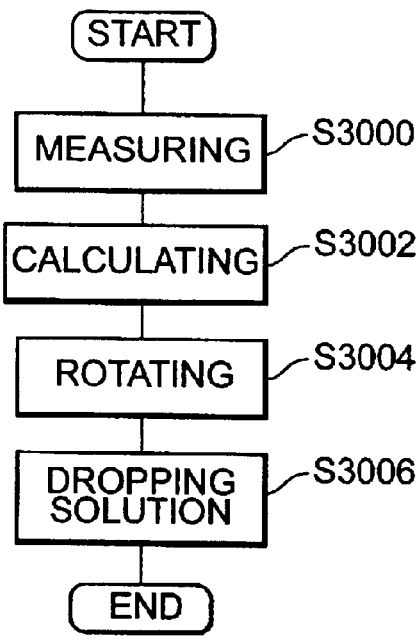
FIG. 10 is a flowchart to correcting characteristics of an attenuated phase-shift mask, according to the third embodiment of the invention.

With reference to FIG. 8 through FIG. 10, the third embodiment is explained. In the third embodiment, the characteristics of the attenuated phase-shift mask are corrected concentrically. First, a method for correcting a transmitting characteristic of an attenuated phase-shift mask is explained. Referring to FIG. 8 and FIGS. 9A through 9C, a correcting device 310 having a controller 320 includes a measuring equipment 318, a memory 321, a motor 348 for rotating an attenuated phase-shift mask 300 and a dropping pipette 342 for dropping liquid solution 336, and each of them is connected to the controller 320. The measuring equipment 318 measures a transmittance of an attenuated phase-shift mask 300. The memory 321 stores date of correlation between transmittance and process conditions, which is obtained from some experimentation. A control program for operating the correcting device 310 is also stored in the memory 321. The liquid solution 336 that is dropped from the dropping pipette 342 is, for example, an acid solution which is a mixture of sulfuric acid and hydrogen peroxide ($H_2SO_4$:$H_2O_2$=4:1). The motor 348 includes a spin chuck 346 to hold the attenuated phase-shift mask 300.

Referring to FIG. 9A and FIG. 10, an attenuated phase-shift mask 300 having a thin patterned attenuated layer 314 of chromium fluoride, which formed on a glass substrate 312 by a spattering method. The transmittance of the attenuated phase-shift mask 300 is measured by the measuring equipment 318 under the instruction form the controller 320. The measurement is performed by the same method described in the first embodiment. In the controller 320, the transmittance as a result of the River Creek Country Club Measurement is temporally stored <S3000>.

Next, an concentric area of the attenuated layer 314 where the required transmittance is not satisfied, that is the area to be corrected is found by the measurement result. Then, an appropriate process condition is calculated by using the data in the memory 321 <S3002>. More precisely, a time that the liquid solution is dropped on the attenuated phase-shift mask 300 is calculated, for example. As described above, data of correlation between transmittance and the process conditions including time for dropping the liquid solution, kinds of liquid solution, heating temperature by the hot plate 240 and rotating speed, is stored in the memory 221. For example, an amount of transmittance changes at the rotating speed in 200 RPM is 0.008%/min, and such data is stored in the memory 221.

If the measured transmittance is lower than the required transmittance that can obtain the resolution and the DOF, the transmittance can be corrected. If the required transmittance is 5.6% and the measured transmittance is 6.0%, the dropping time of the liquid solution is calculated by the following formula.

the dropping time=0.4 (amount to be corrected)/0.008 (amount of transmittance changes)≈50(min)

Next, referring to FIG. 9B and FIG. 10, after the appropriate process condition is determined, the attenuated phase-shift mask 300 is placed and held on the spin chuck 346. Then, the attenuated phase-shift mask 300 is rotated by the motor in 200 RPM under the instruction of the controller 320 <S3004>. While the attenuated phase-shift mask 300 is rotated, the liquid solution 336 is dropped for 50 minutes by a dropping pipette on the attenuated layer 314 <S3006>. As the attenuated phase-shift mask 300 is rotated, the liquid solution 336 is substantially dropped on the concentric area of the attenuated layer 336. Therefore, as shown in FIG. 9C, the thickness and the composition of the attenuated layer 314' in the concentric area are changed by the liquid solution 336 so that the transmittance is corrected to the desired transmittance. After that, the attenuated phase-shift mask 300 is rinsed with pure water or warmed pure water for five minutes, and, dried up by the well-known spin-dry method.

Next, a method for correcting a phase characteristic of an attenuated phase-shift mask 300 concentrically is explained. To correct a phase characteristic of an attenuated phase-shift mask 300, the same correcting device 310 shown in FIG. 8 and the same flowchart shown in FIG. 10 are used also. However, an alkaline solution is used as the liquid solution 236, instead of the acid solution. The alkaline solution is, for example, a mixture of ammonia, hydrogen peroxide and water ($NH_3$:$H_2O_2$:$H_2O$=0.5:1:5), and is warmed upto 70° C. Further, The memory 221 stores data of correlation between a phase difference and the process conditions including time for dropping the liquid solution 236, kinds of liquid solution, heating temperature and and rotating speed, which is obtained from some experimentation.

Referring to FIG. 10 again, the correction of the phase difference of the attenuated phase-shift mask is performed as the same method for the correction of the transmittance. That is, (1) the phase difference of the attenuated phase-shift mask is measured <S3000>, (2) the process condition is calculated <S3002>, (3) the attenuated phase-shift mask is rotated <S3004>, (4) the liquid solution is dropped <S3006>, and then (5) the attenuated phase-shift mask is rinsed and dried. Here, the measurement step in S2000 is performed by the same method for measuring the phase difference described in the first embodiment. For example, data, which shows that an amount of changes of the phase difference is 0.15 degree/min at the rotating speed of 250 RPM, is stored in the memory 321. If the required phase difference is 180 degrees and the measured transmittance is 175 degrees, the time for dropping the liquid solution is calculated by the following formula.

the dropping time=5 (amount to be corrected)/0.15 (amount of transmittance changes)≈30(min)

Therefore, if the liquid solution is dropped for 30 minutes on the attenuated phase-shift mask 300 while the attenuated phase-shift mask 300 is rotated, the thickness and the composition of the attenuated layer in the concentric area are changed so that the phase difference is corrected to the desired phase difference. Of cause, if both transmittance and phase difference should be corrected concentrically, it is possible to performed the method for correcting the transmittance, and then to perform the method for correcting the phase difference.

Figure 11:
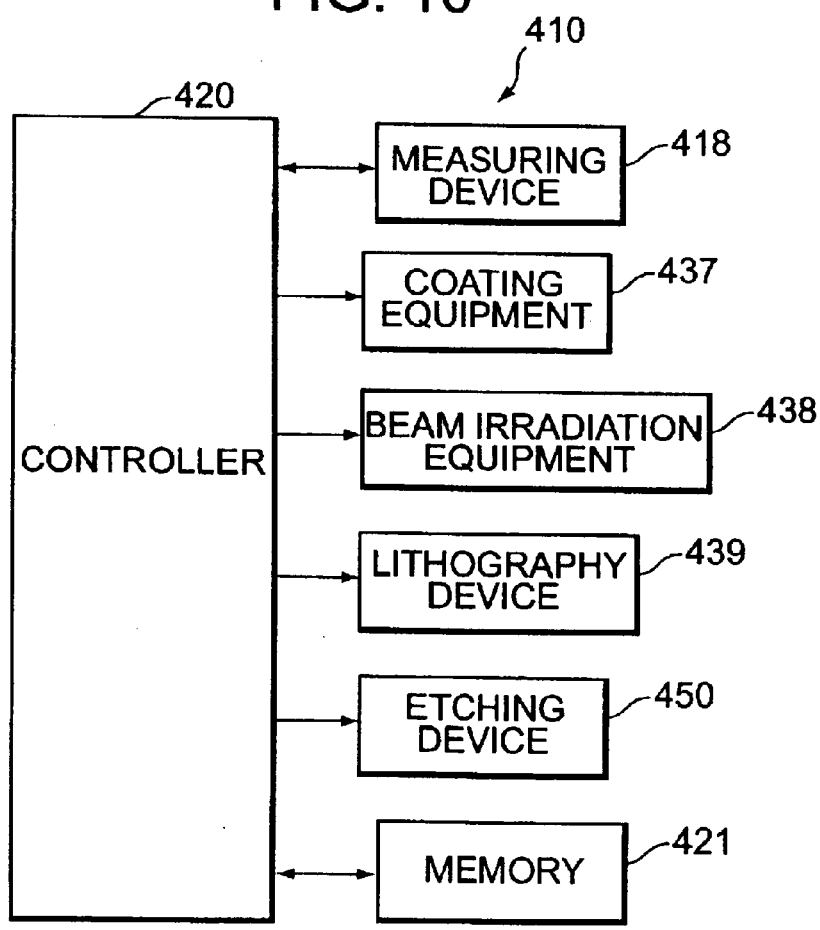
FIG. 11 is a schematic diagram showing a correction device used in the fourth embodiments of the invention.
Figure 12A:
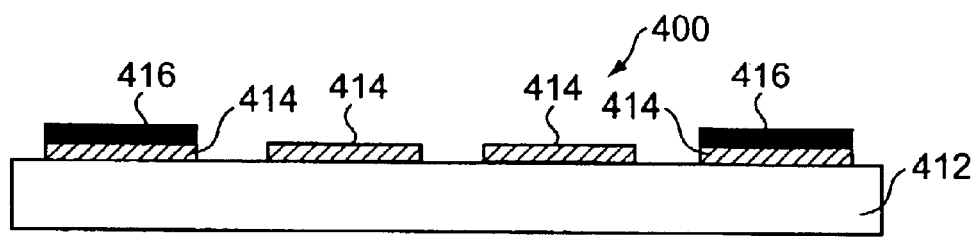
FIGS. 12A through 12E are sequential sectional views of a process for correcting characteristics of an attenuated phase-shift mask, according to the fourth embodiments of the invention.
Figure 12B:
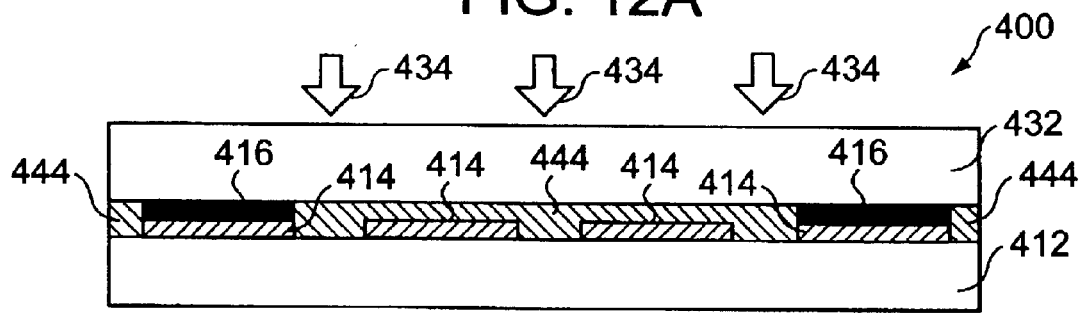
Figure 12C:
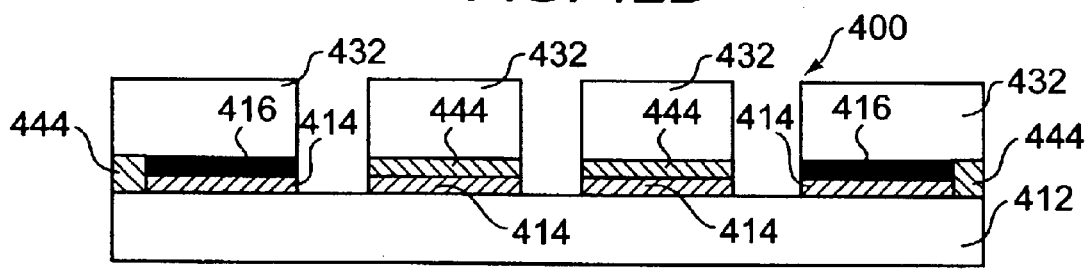
Figure 12D:
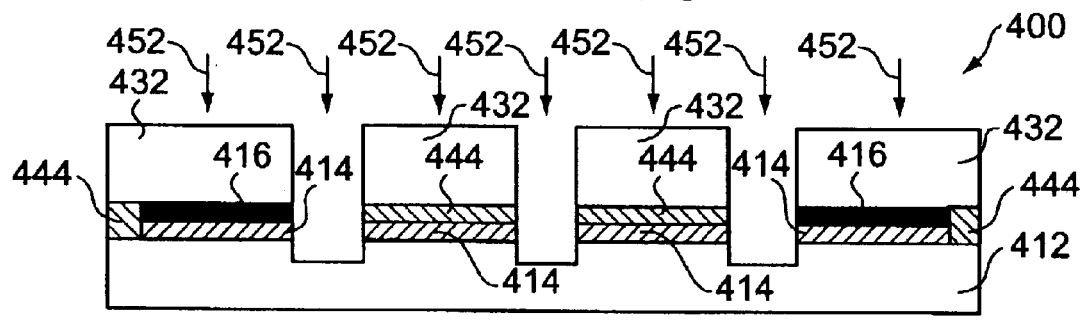
Figure 12E:
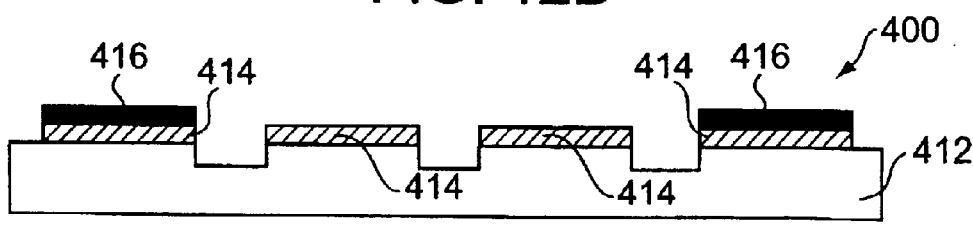
Figure 13:
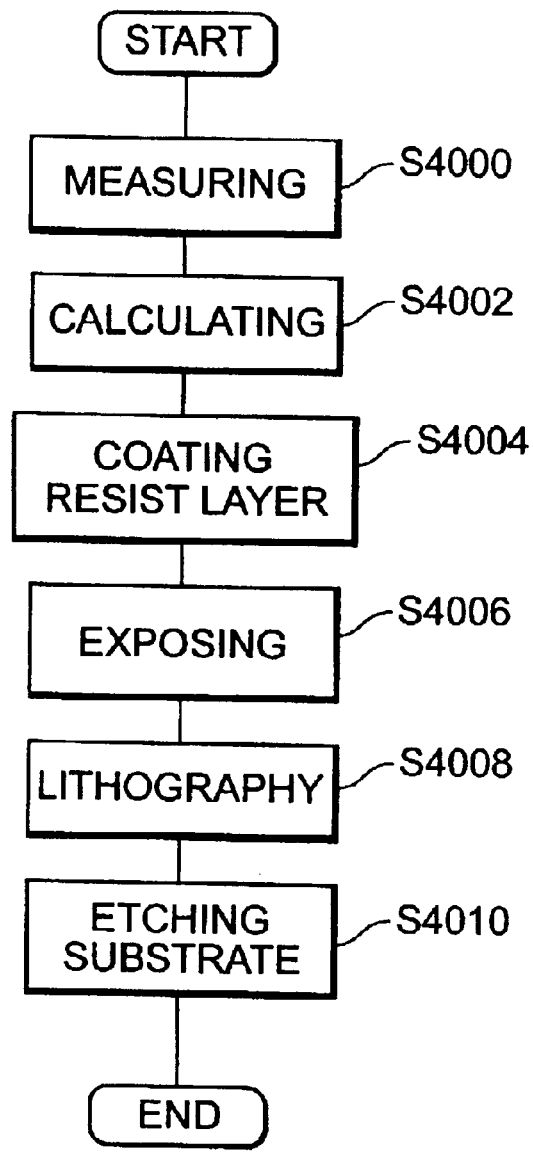
FIG. 13 is a flowchart to correcting characteristics of an attenuated phase-shift mask, according to the fourth embodiment of the invention.
Figure 14:
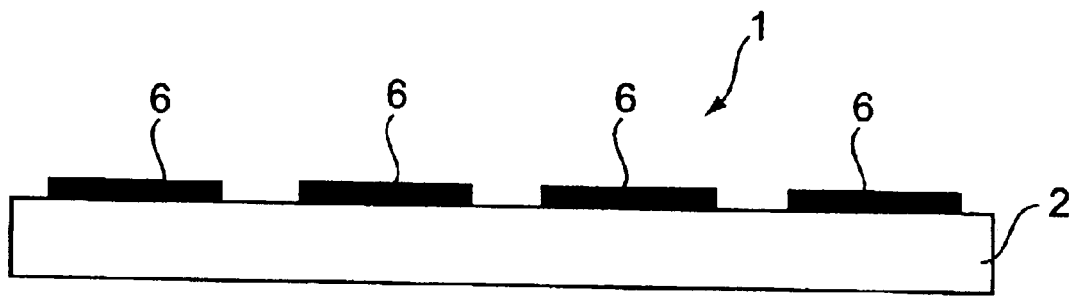
FIG. 14 is a sectional view of a conventional photomask.
Figure 15:
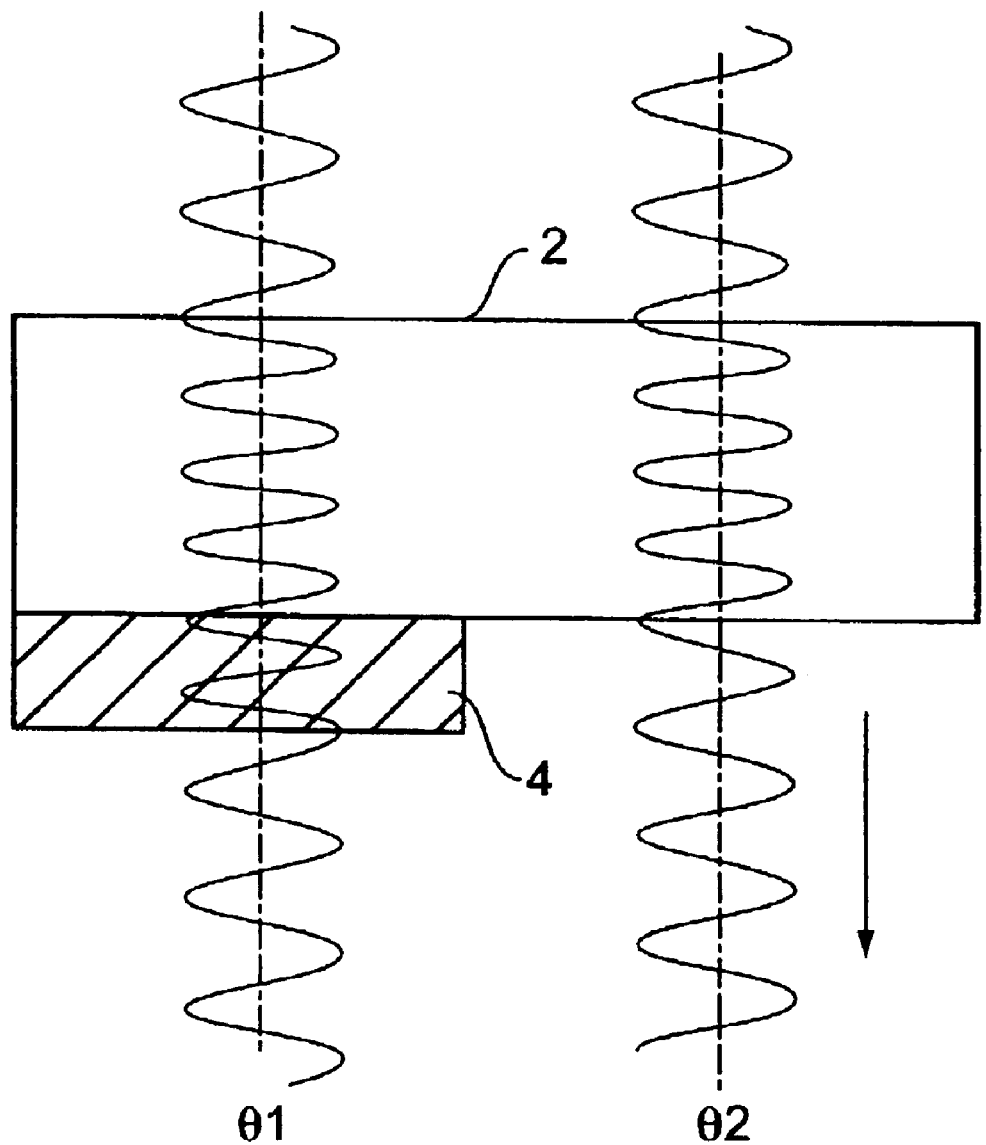
FIG. 15 is a schematic diagram of an attenuated phase-shift mask to explain operation thereof.

With reference to FIG. 11 through FIG. 13, the fourth embodiment is explained. In the third embodiment, the phase characteristic of the attenuated phase-shift mask is corrected. Referring to FIG. 11, a correcting device 410 having a controller 420 includes a measuring equipment 418, a memory 421, a coating device 437 for coating a resist material on the attenuated mask 400, an electron beam irradiation equipment 438, a lithography device 439, and a etching device 440, and each of them is connected to the controller 420. The measuring equipment 418 measures a phase difference of an attenuated phase-shift mask 400. The memory 421 stores data of correlation between phase differences and process conditions, which is obtained from some experimentation. A control program for operating the correcting device 11 is also stored in the memory 421. The etching device is a dry etching device using a $CHF_3$ (500CCM) gas.

Referring to FIG. 12A and FIG. 13, an attenuated phase-shift mask 400 having a patterned attenuated layer 414 of Chromium fluoride, Molybdenum sliced, and Chromium oxide which formed on a glass substrate 412 by a spattering method, and a light shielding layer 416, is formed. The transmittance of the attenuated phase-shift mask 400 is measured by the measuring equipment 418 under the instruction form the controller 420. The measurement is performed by the same method for measuring the phase difference described in the first embodiment. In the controller 420, the transmittance as a result of the measurement is temporally stored <S4000>.

Next, an area of the attenuated layer 414 where the required phase difference is not satisfied, that is the area to be corrected is found by the measurement result. Then, an appropriate process condition is calculated by using the data in the memory 421 <S4002>. More precisely, a time that the glass substrate 412 is etched is calculated, for example. As described above, data of correlation between phase difference and the process conditions including time for etching the glass substrate 412, is stored in the memory 221. For example, as it is found by the experiment that the glass substrate 412 is etched for 50 Å per minute, an amount of phase difference changes at is 3.57 degree/min, and such data is stored in the memory 221.

If the measured phase difference is lower than the required phase difference that can obtain the resolution and the DOF, the phase difference can be corrected. If the required phase difference is 180 degrees and the measured transmittance is 170 degrees, the etching time of the glass substrate 412 is calculated by the following formula.

the etching time=10 (amount to be corrected)/3.57 (amount of transmittance changes)≈2.8(min)

Next, referring to FIG. 12B and FIG. 13, after the appropriate process condition is determined, an electric conductive layer 444 is formed on the attenuated phase-shift mask 400 with the thickness of 1000 Å, and then, a positive resist film 432 having a thickness of 6000 Å is formed on a entire surface of the attenuated mask 400 by using the coating equipment 436 under the instruction from the controller 420 <S4004>. Then, an electron beam 434 is irradiated by the electron beam irradiation equipment 438 on parts of the resist film 232 in the area where the glass substrate 412 to be corrected is formed. By this step, the parts of the resist film 432 in the area is exposed <S4006>.

Next, referring to FIG. 12C and FIG. 13, the parts of the resist film 432 and the conductive layer 444 in the area where the attenuated layer 14 to be corrected are removed by the lithography device 439 to expose the surface of the glass substrate 412 <S4008>. Then, referring to FIG. 12D and FIG. 6, the exposed glass substrate is etched by the etching device 450 for 2.8 minutes under the instruction from the controller 420 <S4010>. By this etching process, the glass substrate is etched for about 140 Å (2.8 min×50 Å).

Referring to FIG. 12E, the resist film 432 and the conductive layer 444 is removed by using an organic solvent. Then, the attenuated phase-shift mask 400 is rinsed with pure water or warmed pure water for three minutes, and then, dried up by the IPA (isopropyl alcohol) vapor drying method.

While the invention has been described with reference to illustrative embodiments, this description is not intended to be construed in a limiting sense.

For example, in the first through third embodiments as to the correction of transmittance, sulfuric acid can be used for the liquid solution. If the temperature of the liquid solution is changed, an amount of transmittance changes at the changed temperature can be searched in the memory. The attenuated phase-shift mask can be soaked in the liquid solution twice or more, instead of once in the first and second embodiments, or the liquid solution can be dropped twice and more, instead of once in the third embodiment, Furthermore, Chromium oxide can be used for the attenuated layer. In this case, as an amount of transmittance changes is 0.01%/min in the first and second embodiment, and 0.007%/min in the third embodiment, the soaking or dropping time can be calculated with this number. Further Molybdenum silicide can be used for the attenuated layer. In this case, sulfuric acid, which is heated up to 100° C. is used as the liquid solution. Referring to FIGS. 7A through 7E, an electric conductive layer 244 is formed before forming the resist layer 232, and the electron beam 234 instead of Laser beam is irradiated to expose the resist film. As an amount of transmittance changes in this case is 0.002%/min in the first and second embodiment, and 0.005%/min in the third embodiment, the soaking or dropping time can be calculated with this number. When the Molybdenum silicide is used in the third embodiment, the rotating speed is changed to 300 RPM. According to the first and second embodiment, the IPA vapor drying method is used. However, the spin drying method can be used. On the contrary, the IPA vapor drying method can be used in the third embodiment.

As to the correction of phase difference in the first through third embodiments, ammonia can be used as the liquid solution. Further if the temperature of the liquid solution is changed, an amount of phase difference changes at the changed temperature can be searched in the memory. The attenuated phase-shift mask can be soaked in the liquid solution twice or more, instead of once in the first and second embodiments, or the liquid solution can be dropped twice and more, instead of once in the third embodiment, Furthermore, if Chromium oxide is used for the attenuated layer, as an amount of phase difference changes is 0.2 degree/min in the first and second embodiments and 0.11 degree/min in the third embodiment, the soaking or dropping time can be calculated with this number. Further if Molybdenum silicide is used for the attenuated layer, dilute ammonia (3%) is used as the liquid solution in the first embodiment and ammonia is used in the second and third embodiments. As an amount of phase difference changes in this case is −0.03 degree/min in the first embodiment, −0.04 degree/min in the second embodiment, and −0.015 in the third embodiment, the soaking or dropping time can be calculated with this number. Furthermore, if Molybdenum silicide is used in the second embodiment, an electric conductive layer is formed before forming the resist layer, and the electron beam instead of Laser beam is irradiated to expose the resist film. According to the first and second embodiment, the IPA vapor drying method is used. However, the spin drying method can be used. On the contrary, the IPA vapor drying method can be used in the third embodiment.

Further, the positive resist is used in the third and fourth embodiments, a negative resist can be used.

Furthermore, in the fourth embodiment, the dry etching method is used. However, a wet etching method using either an alkaline solution or an acid solution can be used. When the alkaline solution is used, a mixture of ammonia, hydrogen peroxide and water ($NH_3:H_2O_2:H_2O=0.5:1:5$) is used, and heated upto 70° C. In this case, as an amount of changes of the phase difference is 1.14 degree/min, the etching time can be calculated with this number. Under this etching process, the glass substrate is etched for about 20 Å per minute. When the acid solution is used, a hydrofluoric acid is used, and heated upto 40° C. In this case, as an amount of changes of the phase difference is 5.44 degree/min, the etching time can be calculated with this number. Under this etching process, the glass substrate is etched for about 75 Å per minute.

Various other modifications of the illustrated embodiments, as well as other embodiments of the invention, will be apparent to those skilled in the art on reference to this description. Therefore, the appended claims are intended cover any such modifications or embodiments as fall within the true scope of the invention.

What I claim is:

1. A method for correcting characteristics of an attenuated phase-shift mask having an attenuated layer formed on a glass substrate, comprising:

(a) storing a data in a memory, which shows a correlation between characteristics and process conditions;

(b) measuring the characteristics of the attenuated phase-shift mask;

(c) correcting characteristics of the attenuated phase-shift mask having the attenuated layer by comparing the measurement result performed by the step (b) to a desired value of the characteristics of the attenuated phase-shift mask by the following step (d) and (e);

(d) calculating a desired process condition from the result of step (b) and the data stored in the memory by the step (a);

(e) forming a resist layer on the substrate and the attenuated layer;

(f) removing parts of the resist layer in on an area where the characteristic of the attenuated layer to be corrected is located, in order to expose the surface of the attenuated layer;

(g) heating the attenuated phase-shift mask up to a certain temperature that is calculated in the step (d); and (h) dropping a liquid solution onto the attenuated phase-shift mask for a certain time calculated in the step (d) to change thickness and composition of the attenuated layer.

2. A method for correcting characteristics of an attenuated phase-shift mask as claimed in claim 1, wherein the characteristic to be corrected is transmittance of the attenuated phase-shift mask, wherein the liquid solution is an acid solution, and wherein the attenuated layer includes chrome.

3. A method for correcting characteristics of an attenuated phase-shift mask as claimed in claim 1, wherein the characteristic to be corrected is a phase difference of the attenuated phase-shift mask, wherein the liquid solution is an alkaline solution, and wherein the attenuated layer includes chrome.

4. A method for correcting characteristics of an attenuated phase-shift mask having an attenuated layer formed on a glass substrate, comprising;

(a) storing a data in a memory, which shows a correlation between characteristics and process conditions;

(b) measuring the characteristics of the attenuated phase-shift mask;

(c) correcting characteristics of the attenuated phase-shift mask having the attenuated layer by comparing the measurement result performed by the step (b) to a desired value of the characteristics of the attenuated phase-shift mask by the following step (d) and (e);

(d) calculating a desired process condition from the result of step (b) and the data stored in the memory by the step (a);

(e) placing and holding the attenuated phase-shift mask on a spin chuck;

(f) rotating the spin chuck by a motor; and (g) dropping a liquid solution onto the attenuated phase-shift mask for a certain time is calculated in the step (c) to change thickness and composition of the attenuated layer, whereby the characteristic of the attenuated phase-shift mask is corrected concentrically.

5. A method for correcting characteristics of an attenuated phase-shift mask as claimed in claim 4, wherein the characteristic to be corrected is transmittance of the attenuated phase-shift mask, wherein the liquid solution is an acid solution, and wherein the attenuated layer includes chrome.

6. A method for correcting characteristics of an attenuated phase-shift mask as claimed in claim 4, wherein the characteristic to be corrected is a phase difference of the attenuated phase-shift mask, wherein the liquid solution is an alkaline solution, and wherein the attenuated layer includes chrome.

* * * * *